United States Patent
Kartäusch et al.

(10) Patent No.: US 10,649,058 B2
(45) Date of Patent: May 12, 2020

(54) RECORDING A MAGNETIC RESONANCE DATA SET

(71) Applicants: Ralf Kartäusch, Erlangen (DE); Dominik Paul, Bubenreuth (DE)

(72) Inventors: Ralf Kartäusch, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 73 days.

(21) Appl. No.: 15/950,125

(22) Filed: Apr. 10, 2018

(65) Prior Publication Data

US 2018/0292500 A1    Oct. 11, 2018

(30) Foreign Application Priority Data

Apr. 11, 2017 (DE) .......................... 10 2017 206 182

(51) Int. Cl.
*G01V 3/00* (2006.01)
*G01R 33/567* (2006.01)
*G01R 33/483* (2006.01)
*G01R 33/563* (2006.01)

(52) U.S. Cl.
CPC ..... *G01R 33/5673* (2013.01); *G01R 33/4838* (2013.01); *G01R 33/563* (2013.01); *G01R 33/5676* (2013.01)

(58) Field of Classification Search
CPC .............. G01R 33/543; G01R 33/5659; G01R 33/3415; G01R 33/36; A61B 5/055
USPC ....................................................... 324/309
See application file for complete search history.

(56) References Cited

U.S. PATENT DOCUMENTS

| | | | | |
|---|---|---|---|---|
| 5,985,162 | A * | 11/1999 | Han ....................... | B82Y 25/00 216/22 |
| 6,078,175 | A * | 6/2000 | Foo ................... | G01R 33/56341 324/300 |
| 7,620,441 | B2 | 11/2009 | Boese et al. | |
| 9,414,767 | B2 | 8/2016 | Speier | |
| 2007/0188172 | A1* | 8/2007 | Garwood ............... | G01N 24/10 324/310 |
| 2008/0150532 | A1 | 6/2008 | Slavin | |
| 2008/0154121 | A1 | 6/2008 | Kouwenhoven | |
| 2009/0149768 | A1* | 6/2009 | Sprung ................ | A61B 5/0205 600/523 |
| 2010/0324409 | A1* | 12/2010 | Assmann ............... | A61B 5/055 600/410 |

(Continued)

FOREIGN PATENT DOCUMENTS

| | | |
|---|---|---|
| DE | 102009061198 B3 | 2/2014 |
| DE | 102013226638 A1 | 6/2015 |

OTHER PUBLICATIONS

German Search Report for German Application No. 10 2017 206 182.0 dated Dec. 18, 2018.

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for recording a magnetic resonance data set relating to a region that is moved at least partly and periodically includes prompting a trigger signal. The method also includes emitting a saturation pulse to at least partially saturate magnetization of an examination region as a function of the trigger signal.

18 Claims, 6 Drawing Sheets

(56) References Cited

U.S. PATENT DOCUMENTS

2011/0009764 A1\* 1/2011 Lanier ................. A61B 5/0833
              600/532
2011/0152669 A1  6/2011 Kassai
2015/0173642 A1\* 6/2015 Blumhagen .......... A61B 5/0402
              600/413

\* cited by examiner

RECORDING A MAGNETIC RESONANCE DATA SET

This application claims the benefit of DE 10 2017 206 182.0, filed on Apr. 11, 2017, which is hereby incorporated by reference in its entirety.

BACKGROUND

The present embodiments relate to recording a magnetic resonance data set relating to an examination region that is moved at least partly and periodically.

Examination regions that move lead to artifacts in magnetic resonance images and spectra due to phase errors. Allowing for movements in the examination region is therefore known.

The term "periodic movements" in the context of magnetic resonance examinations usually denotes movements caused by the heartbeat and/or breathing. With these, it is possible to split up a movement cycle into a plurality of movement phases.

A plurality of strategies are possible for minimizing movement artifacts. First, the recording may be based in the movement phases of the movement cycle in which the movement amplitude is low. With cardiac images, the measurement may be made during diastole, for example, and with pulmonary images, during expiration.

Triggered magnetic resonance measurements are known from documents DE 10 2009 061 198 B3, U.S. Pat. No. 9,414,767 B2, and U.S. Pat. No. 7,620,441 B2, for example.

By starting out with a trigger signal, one or a plurality of partial recordings may be initiated in order to generate the part of a data set for each movement phase. With movements of the heart, an ECG signal from the test subject or patient is evaluated and the data recording is triggered as a function of the ECG signal. In the case of cine-recordings, after a trigger signal, in each case one k-space line of an image may be acquired consecutively. In this way, a plurality of images are acquired, one image for one movement section in the cardiac cycle. If the images are played back one after another, the heart may be seen beating.

A plurality of methods are known for determining breathing movements. The movements of the abdomen may be detected by a measuring belt. The belt does not affect the MR measurements, but provides only approximate information about the deformation of the abdomen in the examination region.

Therefore, a further known method is recording navigator echoes. Here, one or a plurality of 2D-slices or 3D-volumes are read in predetermined orientations and, from the differences in otherwise identical recording conditions, it is concluded that translations and rotations have occurred in the region being observed. With this method, movements may be detected very accurately, but the drawback is that the signal in the image region of an image may be partly saturated due to these measurements.

A problem arises with all the sequences that work with saturation. Saturation occurs when working with a fat- or water-suppression module or sequences that take measurements in the steady-state.

If one proceeds as described, a measurement is initiated after the input of the trigger signal, irrespective of the saturation status of the magnetization in the examination region. This is not a problem with cine-images because cine-images always start with a completely unsaturated magnetization due to the inflow-effect in the region of interest. In all other cases, the state of magnetization is basically undefined.

In steady-state sequences, to compensate for relaxation effects due to the interval between the end of the recording and the next trigger signal, a known method is transmitting HF pulses even without data recording in order to sustain the steady-state. These pulses are also known as saturation pulses. If the pulse emission and the trigger signal cross over in an unfavorable manner, the targeted movement phase may not be maintained.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method for generating a magnetic resonance data set in which movement artifacts are avoided even where there is partial or complete saturation of the magnetization is provided.

In one embodiment, a method for recording a magnetic resonance data set relating to a region that is moved at least partly and periodically includes recording at least one measuring signal for the magnetic resonance data set. The method also includes prompting a trigger signal, and emitting a saturation pulse to at least partly saturate the magnetization of the examination region as a function of the trigger signal.

The aforementioned steps are carried out automatically by a control apparatus.

In known measuring methods, when the trigger signal is present, the data recording is initiated as soon as possible. With image data, for example, this may lead to there being a varying initial magnetization at the beginning of a recording cycle. When all the recording cycles have been carried out and the data is processed, artifacts may occur as a result thereof.

A recording cycle may be the section of a measurement that includes the recording of a measuring signal, and to be precise, of an FID or an echo. Such a measuring section may extend from the first excitation pulse in a recording cycle to the first excitation pulse in the next recording cycle. The measuring sections lasts for a repetition time TR. For example, one k-space line is recorded in one recording cycle.

In the proposed method, it is not the sensor, that is not the generator of the trigger signal, that monitors the measurement, but vice versa. The trigger signal is therefore actively prompted by the control apparatus, and where the signal is present, the data recording is not necessarily initiated. Instead, a choice is made as to whether a saturation pulse is emitted once again or whether the data recording is initiated. Since the saturation status of the magnetization may be estimated relatively accurately, it therefore becomes possible for potential artifacts due to a shift in the movement phase and artifacts due to a divergent saturation to be weighed up one against the other.

Advantageously, a maximum interval from a preceding saturation pulse to at least partly saturate the magnetization of the examination region may be predetermined. A time comparison may be carried out in a simple and reliable manner.

The maximum interval may advantageously be predetermined as a function of the measuring sequence. The dependence of the signal intensity on the saturation varies in measuring sequences. The maximum interval may be set as a function of the measuring sequence.

In one embodiment, when the maximum interval is exceeded, a further saturation pulse to at least partly saturate the magnetization of the examination region may be emitted. Otherwise, for example, the data recording is initiated directly.

Advantageously, at least one navigator echo may be recorded to determine the movement status of the examination region. The movement status may be the movement phase at the time of recording. A navigator echo is a known option for determining the movement status, for example, in the case of respiratory movements. Using the navigator echo, the trigger signal may be generated or the trigger time may be determined.

In one embodiment, the prompting of the trigger signal and/or the emission of a saturation pulse may be carried out a plurality of times in one recording cycle. For example, the prompting of the trigger signal may ensue continuously after the data recording has been completed (e.g., at fixed predetermined time intervals until the signal is present). Alternatively, the prompting of the signal may be suspended for a period of time if no trigger signal may occur during this time.

Advantageously, an MR-independent sensor may be used to generate the trigger signal. As described in the introduction, a measuring belt may be used to determine the respiratory movement phases. Alternatively, image recordings may be used. These may be recorded with video cameras, cameras, or other medical imaging modalities.

The present embodiments also relate to a method for recording a magnetic resonance data set relating to a region that is moved at least partly and periodically. At least two breathing curves are provided, a trigger time is determined from the breathing curves, and at least one parameter of a magnetic resonance sequence is set as a function of the trigger time that has been calculated.

This method may be carried out as an alternative to or in addition to the embodiments of the method that have already been described. The forthcoming trigger time is estimated based on breathing curves that have been recorded. The curves may be continuously, quasi-continuously, or selectively recorded breathing curves. With the aid of the measuring belt described, it is possible, for example, to acquire quasi-continuous measured data for the breathing. The difference lies, for example, merely in the density of the measuring points. Quasi-continuous measured data has a higher density than selective measured data.

The determination of the expected trigger time may take place before the prompting of the trigger time that is described further above. The prompt may then be modified as a function of the trigger time that has been calculated. For example, the prompt density may increase as the expected trigger time approaches.

As an alternative to or in addition to using a measuring belt, the breathing curves may also be determined using navigator echoes. With navigator echoes, the position of the diaphragm may be determined directly, which increases accuracy.

Advantageously, a mean for the measured breathing curves may be taken. Both the geometric mean or the arithmetic mean or any other position measure of location may be used in this case.

The measured data for the breathing curves may be accumulated in a weighted manner. That is, a weighting factor may be used in the measure of location. For example, the older measured data may be given a lower weighting, such that changes in the breathing curve are given sufficient weight, but freak readings are not overvalued.

Instead of the original breathing curves, derivative breathing curves may also be used. In one embodiment, a fit function may be overlaid on the breathing curve or the breathing curves. This is possible both before and after creating a measure of location or a mean value.

In one embodiment, the course of the current breathing curve may be compared with at least one preceding breathing curve in order to monitor the calculated trigger time. That is, the course of the currently recorded breathing curve is compared, for example, with the mean course of the last breathing curves. In this way, during the measurement, a deviation of the next trigger time from the calculated time may be predicted (e.g., a correction of the calculation may be made).

Advantageously, the number of saturation pulses to at least partly saturate the magnetization of the examination region may be set as a function of the calculated trigger time. Alternatively or additionally, the interval between the saturation pulses may be set as a function of the calculated trigger time. As a result thereof, deviations of the actual saturation at the start of a recording cycle from the desired saturation of the magnetization may be minimized.

Advantageously, a steady-state sequence may be used to record a magnetic resonance data set. These sequences offer greater SNR efficiency than other sequences.

In addition, the present embodiments also relate to a data carrier (e.g., a non-transitory computer-readable storage medium) for a control apparatus to control a data generation unit of a magnetic resonance unit, with data to carry out the method disclosed. Advantageously, the data generation unit may be an image generation unit.

The present embodiments further relate to a magnetic resonance unit with a control apparatus. The magnetic resonance unit is characterized in that the control apparatus is configured to carry out the method as described.

The implementation of the aforementioned methods in the control device may be achieved both as software but also as hardware (e.g., hard-wired hardware).

Further variants of the magnetic resonance unit correspond with the respective variants of the method. To avoid unnecessary repetition, reference is therefore made to the respective features of the method and the advantages thereof.

DETAILED DESCRIPTION

Figure 1:
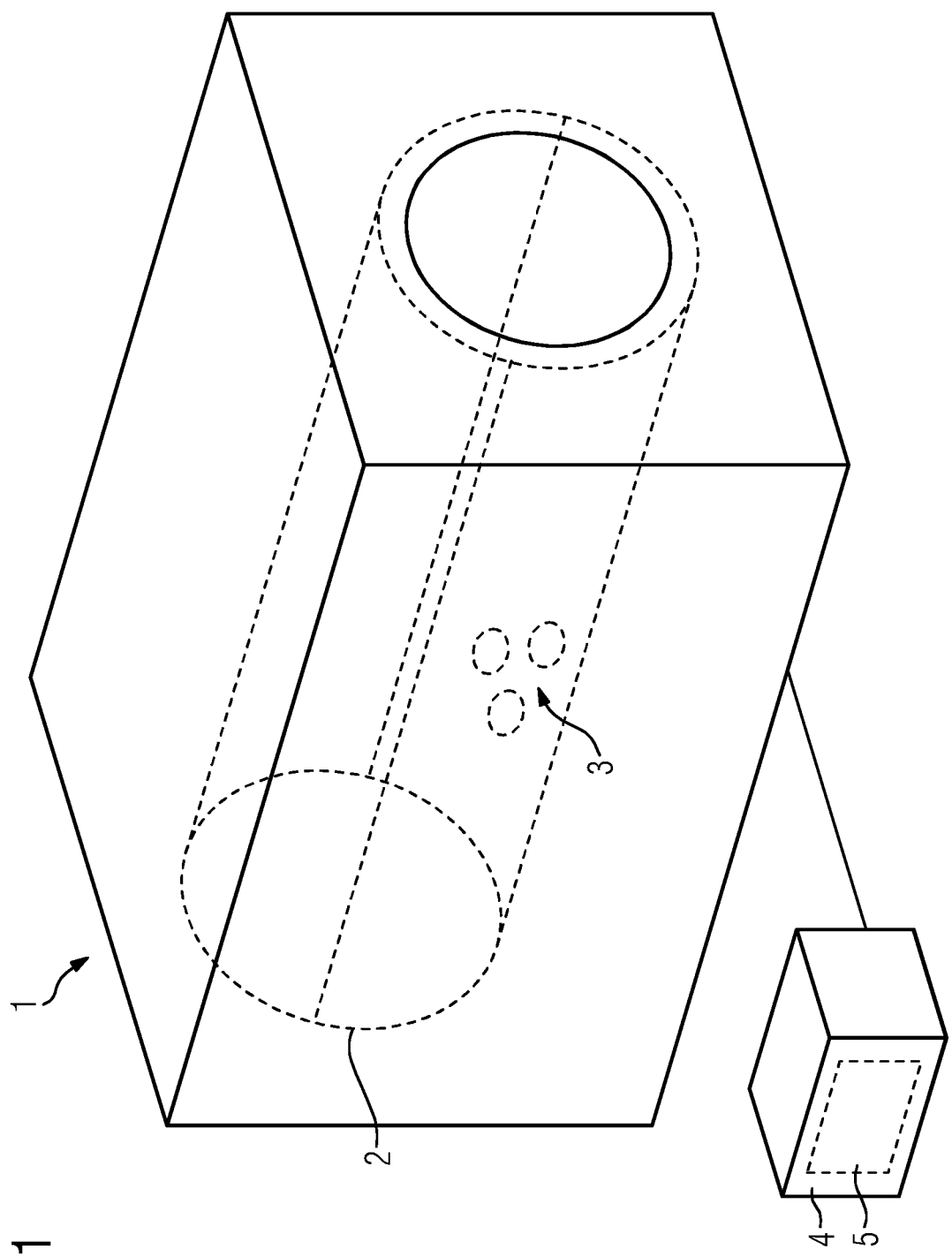
FIG. 1 shows one embodiment of a magnetic resonance unit.

FIG. 1 shows one embodiment of a magnetic resonance unit 1. The magnetic resonance unit 1 includes a high frequency coil 2 embodied as a body coil and a receiving coil array in the form of a coil array 3 and a control apparatus 4.

A body coil such as the coil 2 is used to excite magnetization. The coil array 3 is provided to read the measuring signal. The coils in the coil array 3 may at the same time read the measuring signal in parallel imaging. Instead of a coil array 3, an individual coil may be used as a detection coil.

The magnetic resonance unit 1 further includes a data carrier 5 as part of the control apparatus 4 or independent thereof. On the data carrier 5, computer programs, such as the measuring procedures used to carry out magnetic resonance measurements, which are described further below, are stored.

Figure 2:
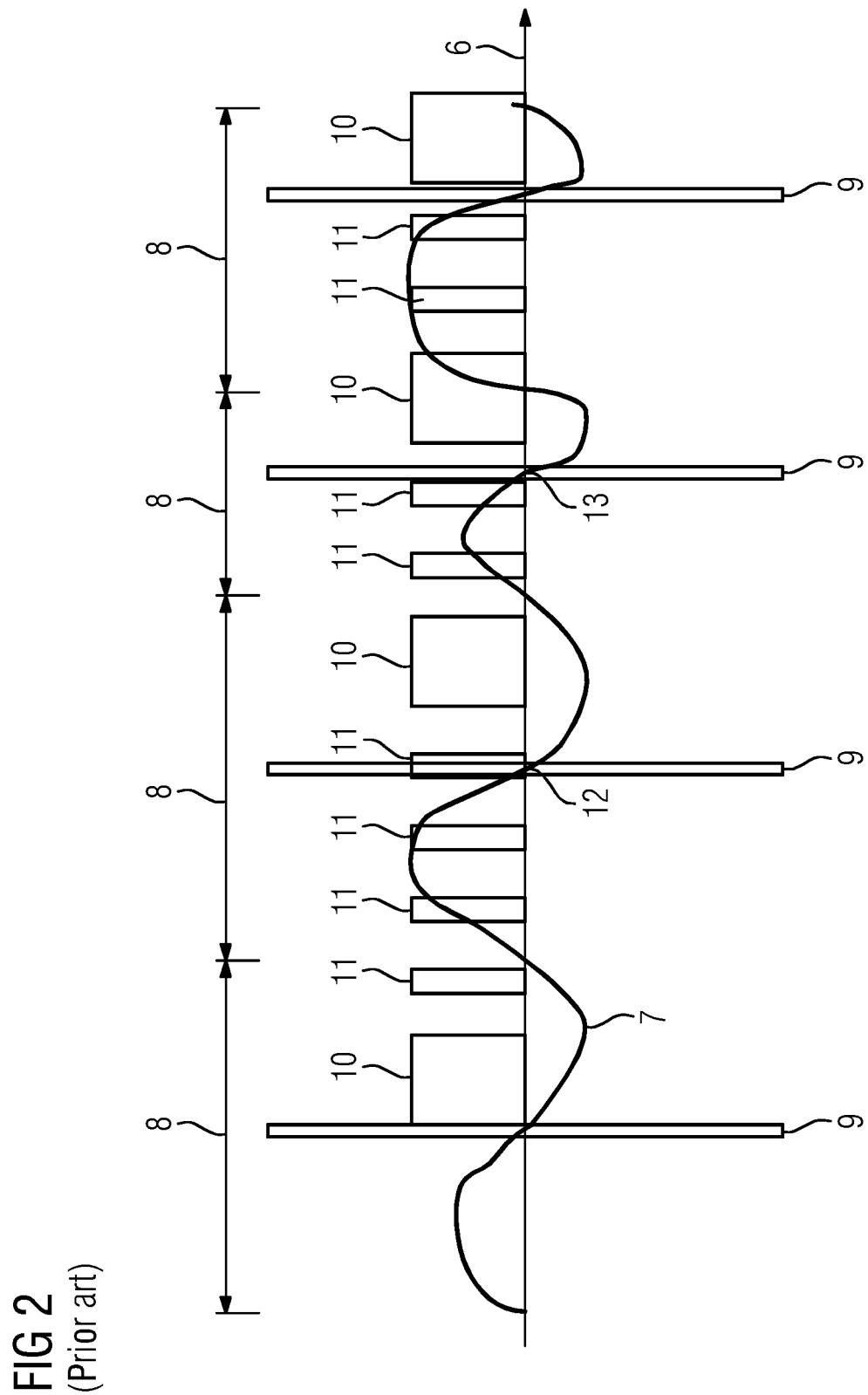
FIG. 2 illustrates a measurement procedure.

FIG. 2 shows a known measuring procedure triggered by breathing. On the axis 6, the time is recorded. In the y-direction, the units are random. The curve 7 contains four breathing cycles or breathing curves 8. These start at the beginning of inspiration.

The trigger signals 9 are emitted as a function of the movement phase. These signals are at the zero passage at the beginning of expiration. Based on a trigger signal 9, a recording sequence 10 with one or a plurality of recording cycles is initiated. The recording sequences 10 are part of one or a plurality of measuring sequences. For example, this may be a segmented FLASH. In each recording sequence 10, four recording cycles, for example, are carried out, and accordingly, four k-space lines are recorded.

After ending the respective recording sequence 10, one or a plurality of saturation pulses 11, with which a magnetization may be maintained in the examination region in a desired saturation state, follow.

At the time 12, the problem arises that a saturation pulse 11 is being applied at the time of the trigger signal 9. As a result thereof, the subsequent recording sequence 10 shifts into a region of the breathing cycle 8 that generates more movement artifacts than the region directly after the trigger signal 9.

At the time 13, the recording sequence may be initiated directly, but due to the time interval from the last saturation pulse 11, the magnetization is not in the desired saturation state.

Figure 3:
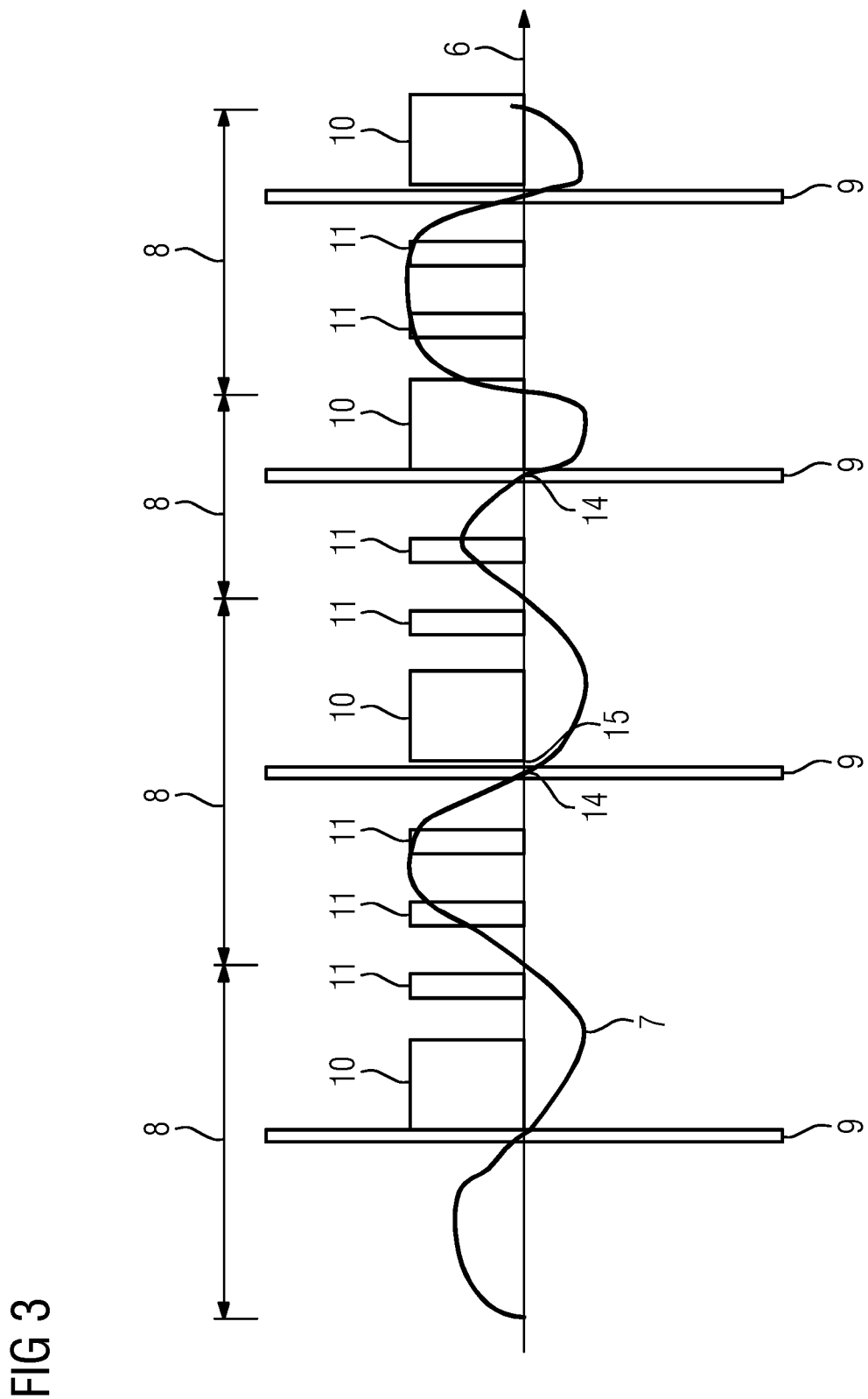
FIG. 3 illustrates a variant of a measurement procedure.

FIG. 3 shows a measuring procedure in which the problems just described are avoided.

The next trigger time 14 may be calculated based on past breathing cycles 8. With this estimate, the number and the position of the saturation pulses 11 are set such that at the time 15, at the start of a recording sequence 10, an optimum saturation of the magnetization is present. In addition to the position and the number, the flip angle and/or the duration of the saturation pulses 11 may also be adjusted.

In addition to estimating the next trigger time 14, the trigger signal 9 is not used unreservedly to initiate the next recording sequence 10. Instead, the trigger signal 9 is prompted and, as a function of the presence of the trigger signal 9, a decision is taken as to when and whether a saturation pulse 11 or a recording sequence 10 is initiated. A choice may therefore be made between an optimized saturation and an optimized breathing or movement phase.

Figure 4:
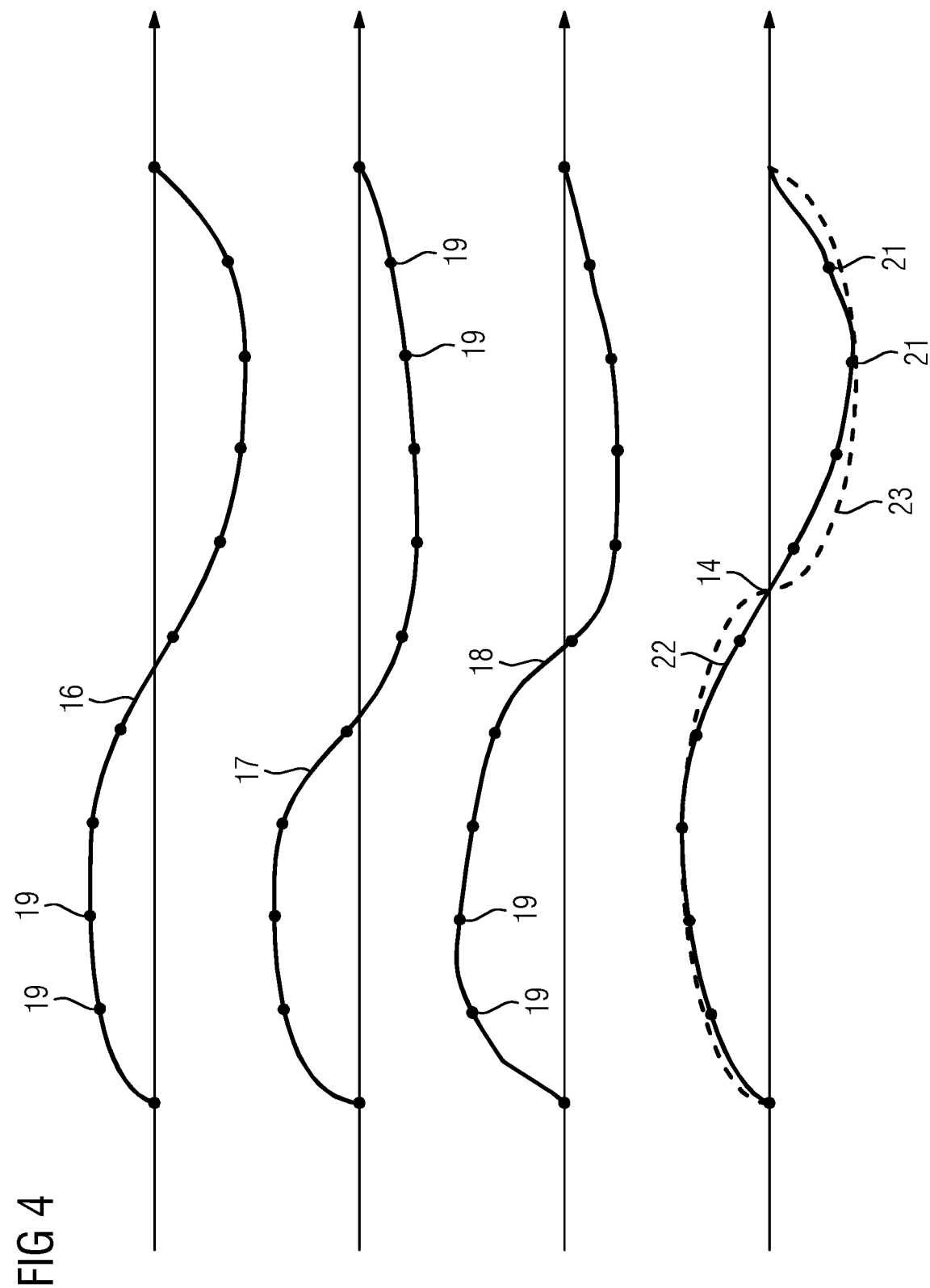
FIG. 4 illustrates another variant of a measurement procedure.

FIG. 4 shows an option for calculating a trigger time 14. The last three breathing cycles 16, 17 and 18 are added together with a weighting. The breathing cycle 16 is the oldest cycle and is entered with a weighting of "1". The breathing cycle 17 is more recent and has a weighting of "2". The breathing cycle 18 is the most recent and has a weighting of "3". In this way, the more recent breathing cycles 17 and 18 are given a higher weighting, and breathing cycles older than breathing cycle 16 are no longer considered at all.

Taking a closer look, only the measuring points 19 are available for each breathing cycle. For reasons of clarity, only a few of these points are denoted by reference signs. In order to predict the time 14 of the next trigger signal 9, the breathing cycles 16, 17, and 18 are accumulated for each time 20 to produce mean measuring points 21 that represent the mean breathing cycle 22. Likewise, only a few of the mean measuring points 21 are denoted by reference signs. For an improved determination of the time 19 of the next trigger signal 14, a fit function 23 may be overlaid on the mean measuring points 21.

The breathing cycles 16, 17, and 18 are initially shown with inspiration and a subsequent expiration. This is purely by way of example; breathing cycles may start at any movement phase in order to calculate a mean breathing cycle 22.

Figure 5:
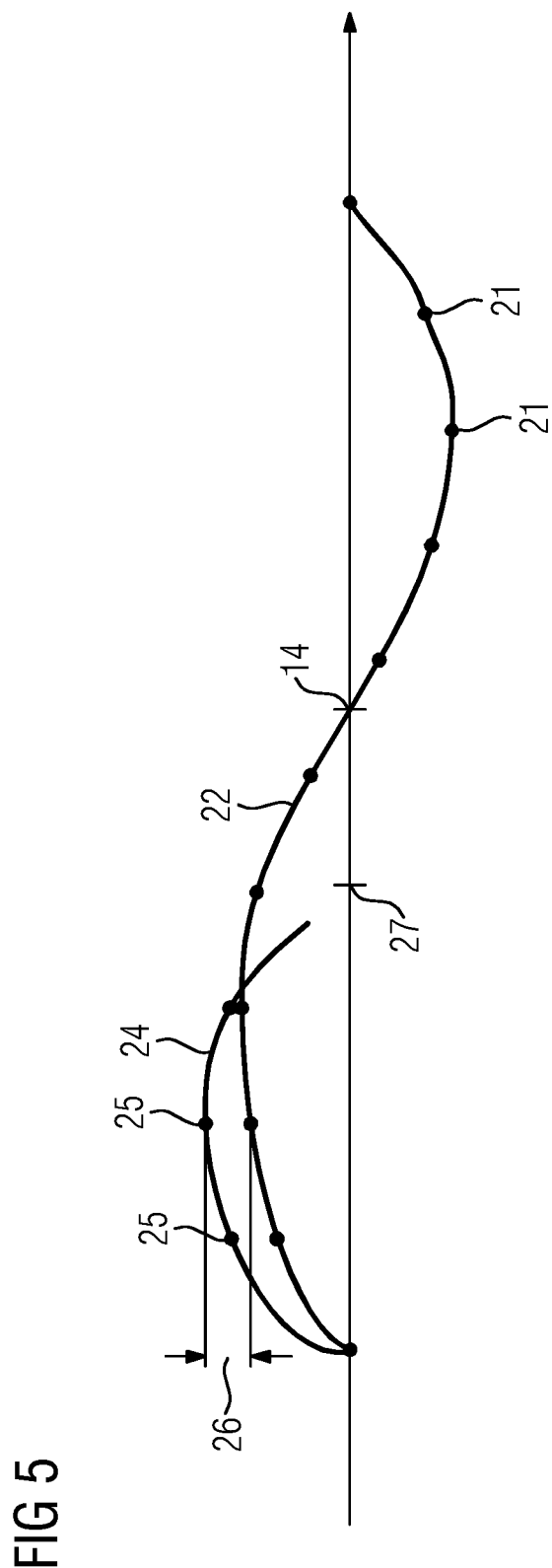
FIG. 5 illustrates yet another variant of a measurement procedure.

FIG. 5 shows a procedure for correcting a trigger time 14. The current breathing cycle 24 or the measuring points thereof 25 are recorded and compared with the mean breathing cycle 22. In the case of divergences 26 of the current breathing cycle 24 from the mean breathing cycle 22, a corrected trigger time 27 may be determined therefrom. The corrected trigger time 27 is likewise an estimated trigger time.

Through the correction, a change in the breathing cycle may be detected directly. However, this change increases the computation effort, since at each measuring point, a check takes place of a position compared with the mean breathing cycle 22, an older breathing cycle, or a cycle course that has been fitted on.

After all the recording sequences 10 have been acquired, a spectrum or an image data set may be generated therefrom.

Figure 6:
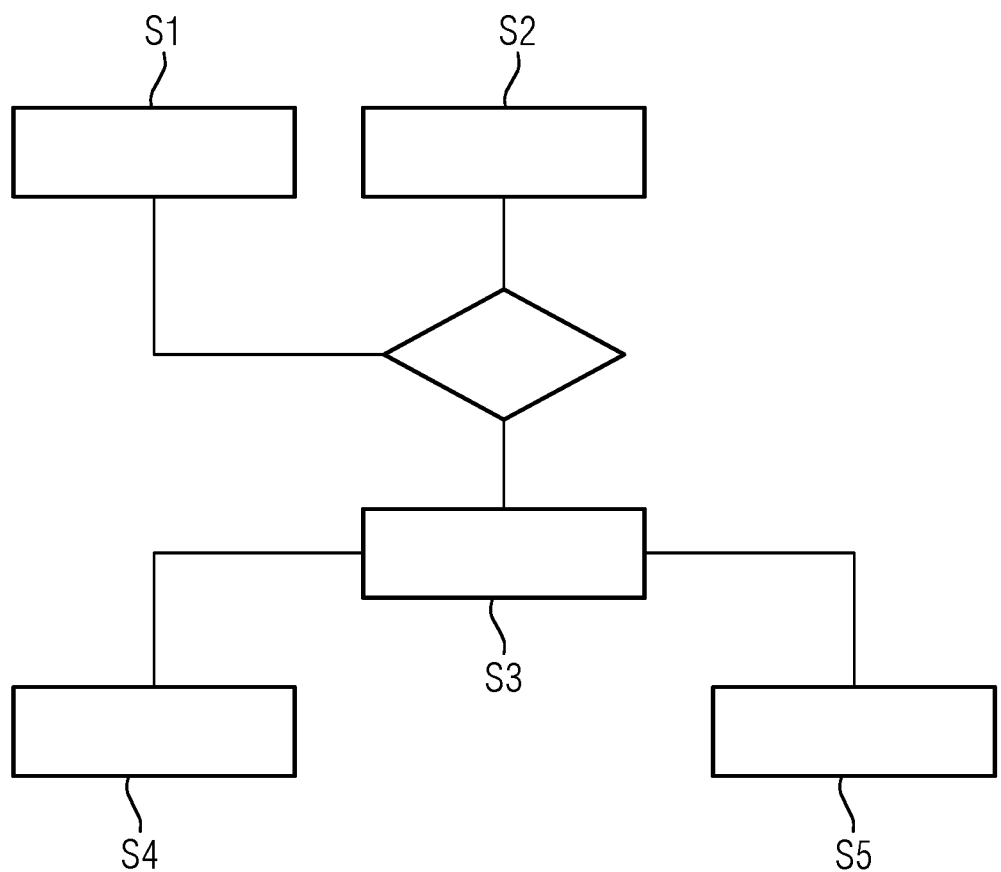
FIG. 6 illustrates a flow chart of an embodiment of a procedure for recording a magnetic resonance data set.

FIG. 6 shows a flowchart for an embodiment of a method for recording a magnetic resonance data set.

It is assumed here that the patient is already in the magnetic resonance unit 1 and that all the preparatory steps such as shimming and scout scans have been carried out. The measuring sequence has likewise been selected, and the slices have been positioned.

In act S1, a saturation module with one or a plurality of saturation pulses 11 is then initiated, such that the magnetization in the examination region has a predetermined saturation.

At the same time, in act S2, the presence of a trigger signal 9 is prompted by the control apparatus 4. Even without predicting the precise time in a region around the expected trigger time, the time interval for the prompt may be shortened. In other words, in a region around this time, a prompt is issued more often.

If the result of the prompt is positive, in act S3, a choice is made as to whether a further saturation pulse 11 is applied or when and whether a recording sequence 10 is initiated. The result is selected such that the degree of saturation is as close as possible to the desired degree of saturation and the movement phase is maintained as precisely as possible. The simplest way of achieving this is in act S3 by the time interval between the time of the trigger signal 9 and the time of the last saturation pulse 11 being compared with a maximum interval or threshold value. If the threshold value has been exceeded, a saturation pulse 11 is applied as act S4, and otherwise, a recording sequence 10 is initiated as act S5.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for recording a magnetic resonance data set relating to an examination region that is moved at least partly and periodically, the method comprising:
   prompting a trigger signal, the trigger signal indicative of a point in time of a movement cycle of the examination region; and
   emitting a saturation pulse to at least partly saturate magnetization of the examination region as a function of the prompted trigger signal.

2. The method of claim 1, wherein a maximum interval from a preceding saturation pulse to at least partly saturate the magnetization of the examination region is predetermined.

3. The method of claim 2, further comprising emitting a further saturation pulse to at least partially saturate the magnetization of the examination region when the maximum interval is exceeded.

4. The method of claim 1, further comprising determining a movement status of the examination region, determining the movement status of the examination region comprising recording at least one navigator echo.

5. The method of claim 1, wherein the prompting of the trigger signal, the emitting of the saturation pulse, or the prompting of the trigger signal and the emitting of the saturation pulse are carried out a plurality of times in a recording cycle.

6. The method of claim 1, wherein an MR-independent sensor is used to generate the trigger signal.

7. The method of claim 1, wherein a steady-state measuring sequence is used to record the magnetic resonance data set.

8. A method for recording a magnetic resonance data set relating to an examination region that is moved at least partly and periodically, the method comprising:
   providing at least two past breathing curves from respective past breathing cycles;
   determining a trigger time of a trigger signal in a next breathing cycle from the at least two past breathing curves, the trigger signal indicative of a point in time along a next breathing curve of the next breathing cycle; and
   setting at least one parameter in a magnetic resonance sequence as a function of the determined trigger time.

9. The method of claim 8, further comprising comparing a course of a current breathing curve with at least one preceding breathing curve to monitor the determined trigger time.

10. The method of claim 8, further comprising setting a number of saturation pulses as a function of the determined trigger time to at least partly saturate a magnetization of the examination region.

11. The method of claim 8, further comprising determining a mean breathing curve, determining the mean breathing curve comprising determining a mean for a plurality of preceding breathing curves.

12. A non-transitory computer-readable storage medium storing instructions executable by a controller to record a magnetic resonance data set relating to an examination region that is moved at least partly and periodically, the instruction comprising:
   prompting a trigger signal, the trigger signal indicative of a point in time of a movement cycle of the examination region; and
   emitting a saturation pulse to at least partly saturate magnetization of the examination region as a function of the prompted trigger signal.

13. The non-transitory computer-readable storage medium of claim 12, wherein a maximum interval from a preceding saturation pulse to at least partly saturate the magnetization of the examination region is predetermined.

14. The non-transitory computer-readable storage medium of claim 13, wherein the instructions further comprise emitting a further saturation pulse to at least partially saturate the magnetization of the examination region when the maximum interval is exceeded.

15. The non-transitory computer-readable storage medium of claim 12, wherein the instructions further comprise determining a movement status of the examination region, determining the movement status of the examination region comprising recording at least one navigator echo.

16. The non-transitory computer-readable storage medium of claim 12, wherein the prompting of the trigger signal, the emitting of the saturation pulse, or the prompting of the trigger signal and the emitting of the saturation pulse are carried out a plurality of times in a recording cycle.

17. The non-transitory computer-readable storage medium of claim 12, wherein an MR-independent sensor is used to generate the trigger signal.

18. A magnetic resonance unit comprising:
   a controller configured to record a magnetic resonance data set relating to an examination region that is moved at least partly and periodically, the recordation comprising:
      a prompt of a trigger signal, the trigger signal indicative of a point in time of a movement cycle of the examination region; and
      an emission of a saturation pulse to at least partly saturate magnetization of the examination region as a function of the prompted trigger signal.

* * * * *